United States Patent
Koda et al.

(10) Patent No.: US 8,792,160 B2
(45) Date of Patent: Jul. 29, 2014

(54) LIGHT-EMITTING DEVICE AND METHOD OF MANUFACTURING THE SAME

(75) Inventors: Rintaro Koda, Tokyo (JP); Hideki Watanabe, Kanagawa (JP); Masaru Kuramoto, Kanagawa (JP); Shunsuke Kono, Kanagawa (JP); Takao Miyajima, Kanagawa (JP)

(73) Assignee: Sony Corporation, Tokyo (JP)

( * ) Notice: Subject to any disclaimer, the term of this patent is extended or adjusted under 35 U.S.C. 154(b) by 139 days.

(21) Appl. No.: 13/614,646

(22) Filed: Sep. 13, 2012

(65) Prior Publication Data
US 2013/0075772 A1     Mar. 28, 2013

(30) Foreign Application Priority Data

Sep. 27, 2011   (JP) .................................. 2011-210355

(51) Int. Cl.
    *H01S 5/22*        (2006.01)
(52) U.S. Cl.
    USPC ...................... 359/344; 372/45.01; 372/44.01
(58) Field of Classification Search
    USPC .............................. 359/344; 372/45.01, 44.01
    See application file for complete search history.

(56) References Cited

U.S. PATENT DOCUMENTS

| 2003/0138014 | A1* | 7/2003 | Lovisa ............................. 372/45 |
| 2006/0093003 | A1* | 5/2006 | Moon et al. ................. 372/46.01 |

FOREIGN PATENT DOCUMENTS

JP        05-067845        3/1993

* cited by examiner

*Primary Examiner* — Mark Hellner
(74) *Attorney, Agent, or Firm* — K&L Gates LLP

(57) ABSTRACT

Provided is a light-emitting device including (a) a layer structure obtained by sequentially growing on a base substrate a first compound semiconductor layer of a first conductivity type, (b) an active layer formed of a compound semiconductor, and (c) a second compound semiconductor layer of a second conductivity type; a second electrode formed on the second compound semiconductor layer; and a first electrode electrically connected to the first compound semiconductor layer. The layer structure formed of at least a part of the second compound semiconductor layer in a thickness direction of the second compound semiconductor layer. The first compound semiconductor layer has a thickness greater than 0.6 μm. A high-refractive index layer formed of a compound semiconductor material having a refractive index higher than a refractive index of a compound semiconductor material of the first compound semiconductor layer is formed in the first compound semiconductor layer.

10 Claims, 10 Drawing Sheets

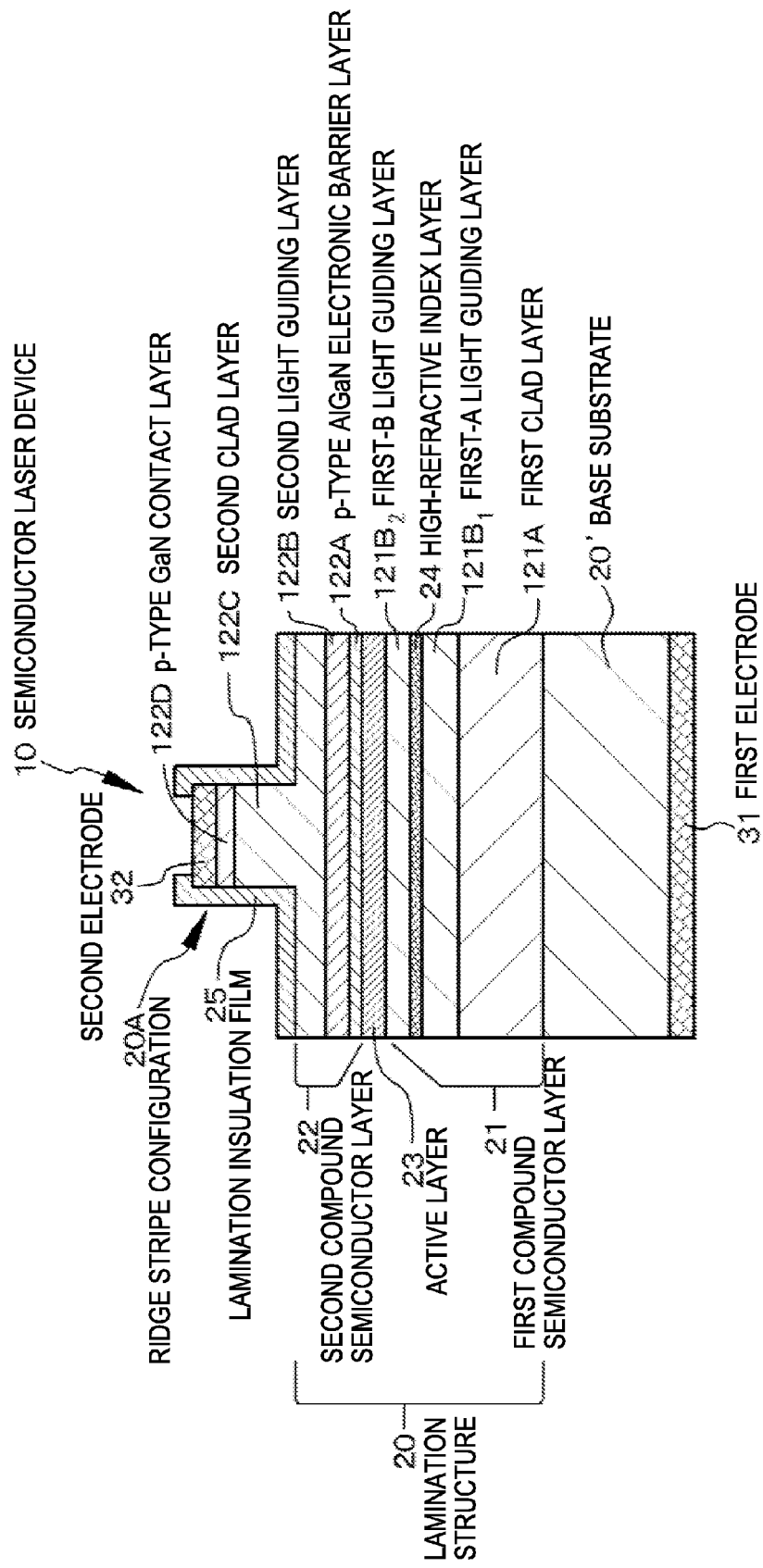

[STEP-110] (CONTINUE)

[STEP-120]

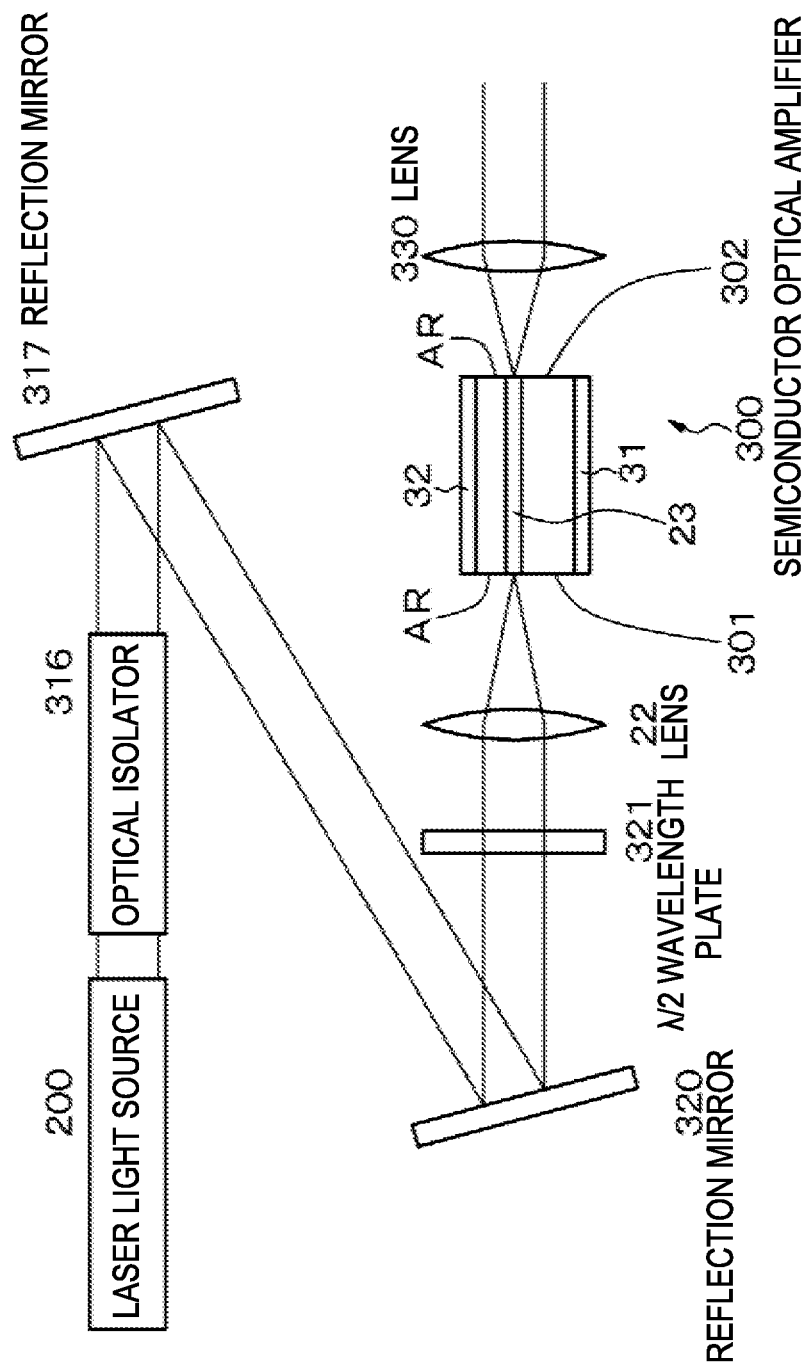

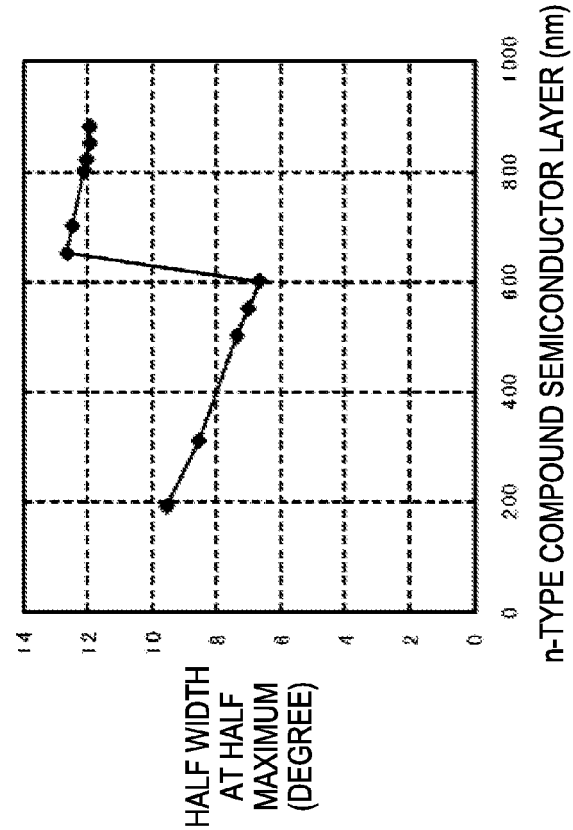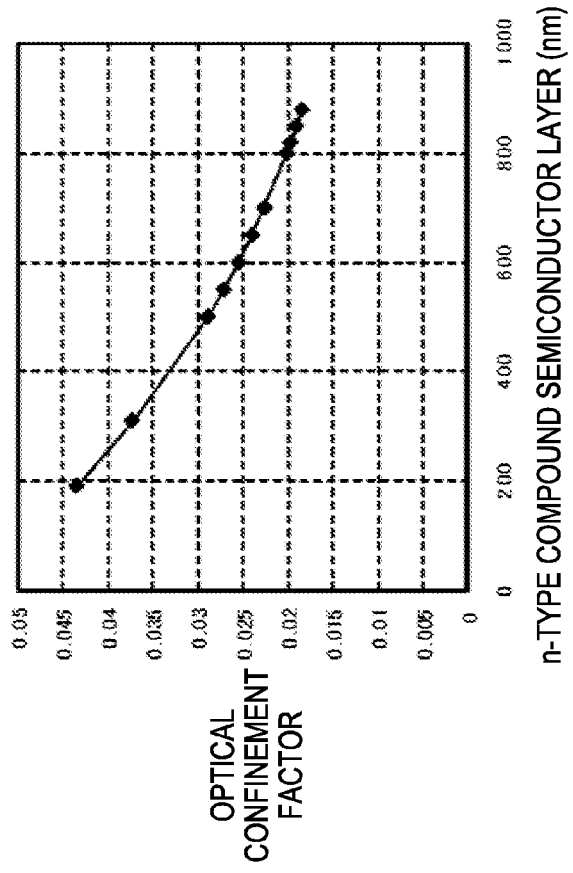

LIGHT-EMITTING DEVICE AND METHOD OF MANUFACTURING THE SAME

BACKGROUND

The present disclosure relates to a light-emitting device and a method of manufacturing the same.

In a laser light source, realizing high power is a major task. Therefore, semiconductor optical amplifiers (SOA) have been studied as devices that amplify light from a laser light source as well as realizing high power of semiconductor laser devices. Here, an optical amplifier is a device that directly amplifies light without converting an optical signal into an electrical signal. The optical amplifier has a laser structure having no resonator and amplifies incident light with an optical gain of the amplifier.

Since optical amplifiers have been developed mainly for optical communication, semiconductor optical amplifiers of a 405 nm band have rarely been put to a practical use. For example, Japanese Unexamined Patent Application Publication No. 5-067845 discloses a semiconductor optical amplifier of a 1.5 µm band which has a tapered ridge stripe configuration in which a GaInAsP-based compound semiconductor is used. According to the technology disclosed in Japanese Unexamined Patent Application Publication No. 5-067845, in the semiconductor optical amplifier, a mode field is expanded along an optical waveguide width by gradually widening the optical waveguide width in a tapered shape from an optical waveguide serving as a narrow incident side, which satisfies single-mode conditions, to an optical waveguide serving as an output side. Thus, the highest output of the semiconductor optical amplifier is designed to be improved.

In general, semiconductor laser devices or semiconductor optical amplifiers have a layer (In the field of laser diode, the word "layer" is used instead of lamination) structure formed on a base substrate. Here, the layer structure includes n-type compound semiconductor layers (specifically, an n-type clad layer and an n-type light guiding layer) doped with n-type impurities, an active layer, and p-type compound semiconductor layers (specifically, a p-type light guiding layer and a p-type clad layer) doped with p-type impurities generally formed from the side of a base substrate.

SUMMARY

One of the methods of realizing the high output of a semiconductor laser device or semiconductor optical amplifier is to lower an optical confinement factor. To lower an optical confinement factor, the thickness of an n-type light guiding layer formed of an n-type compound semiconductor may be thickened, as in FIG. 9A. Thus, the peak of a light field intensity distribution is moved from the active layer to the n-type light guiding layer. As a result, since the optical confinement factor can be lowered and a light density near the active layer can be lowered in a high-output operation, optical damage can be prevented. In particular, in the semiconductor optical amplifier, the saturation energy of the amplified light increases, and thus the high output can be realized. In FIG. 9A, the horizontal axis represents the thickness (unit: nm) of the n-type light guiding layer and the vertical axis represents the optical confinement factor. However, the inventors have proved that when the thickness of the n-type light guiding layer is greater than 0.6 µm, the mode of a light beam output from a semiconductor laser device or semiconductor optical amplifier is not a single mode, as in FIG. 9B. In FIG. 9B, the horizontal axis represents the thickness (unit: nm) of the n-type light guiding layer and the vertical axis represents a half width at half maximum (HWHM) of a far-field pattern (FFP) of which a unit is "degrees." From FIG. 10 showing a near-field pattern, it can be understood that a light beam is not a single-mode light beam but a multi-mode light beam. When the thickness of the n-type compound semiconductor layer is greater than 0.6 µm, the mode of a light beam is considered not to be a single mode to satisfy cutoff conditions of the single mode in a thickness direction of the compound semiconductor layer. Moreover, when the mode of the light beam is not a single mode, there is a problem such as deterioration in the light focusing characteristic in applications when a lens or an optical fiber is used.

It is desirable to provide a high-output semiconductor laser device or a high-output semiconductor optical amplifier capable of outputting a single-mode light beam.

According to an embodiment of the present disclosure, there is provided a light-emitting device, including (a) a layer structure obtained by sequentially growing on a base substrate a first compound semiconductor layer of a first conductivity type, an active layer formed of a compound semiconductor, and a second compound semiconductor layer of a second conductivity type different from the first conductivity type, (b) a second electrode formed on the second compound semiconductor layer; and (c) a first electrode electrically connected to the first compound semiconductor layer. The layer structure has a ridge stripe configuration formed of at least a part of the second compound semiconductor layer in a thickness direction of the second compound semiconductor layer, the first compound semiconductor layer has a thickness greater than 0.6 µm, and a high-refractive index layer formed of a compound semiconductor material having a refractive index higher than a refractive index of a compound semiconductor material of the first compound semiconductor layer is formed in the first compound semiconductor layer.

In the light-emitting device according to the embodiment of the present disclosure, since the first compound semiconductor layer has a thickness greater than 0.6 µm, an optical confinement factor can be lowered. Since the peak of a light field intensity distribution is moved from the active layer to the first compound semiconductor layer, the light density near the active layer can be lowered, and therefore optical damage can be prevented. In particular, in the semiconductor optical amplifier, the saturation energy of the amplified light increases, and thus high output can be realized. Further, since the high-refractive index layer formed of a compound semiconductor material having a refractive index higher than the refractive index of a compound semiconductor material of the first compound semiconductor layer is formed in the first compound semiconductor layer, single-mode conditions in the thickness direction of the compound semiconductor layer can be satisfied in a broader range compared to when the high-refractive index layer is not provided. Therefore, cutoff conditions can be eased, and thus a single-mode light beam can be outputted (or generated).

Additional features and advantages are described herein, and will be apparent from the following Detailed Description and the figures

BRIEF DESCRIPTION OF THE FIGURES

FIG. 1 is a schematic partial sectional view illustrating a light-emitting device according to a first embodiment when the light-emitting device is cross-sectioned along a virtual plane perpendicular to an axis line of the light-emitting device;

FIG. 8 is a conceptual diagram illustrating an optical output apparatus including a semiconductor optical amplifier serving as a light-emitting device according to a second embodiment;

FIG. 9A is a graph illustrating a relation between an optical confinement factor and the thickness of an n-type compound semiconductor layer of a semiconductor laser device or a semiconductor optical amplifier and FIG. 9B is a graph illustrating a relation between far field pattern (FFP) angle and the thickness of the n-type compound semiconductor layer.

DETAILED DESCRIPTION

Figure 2A:
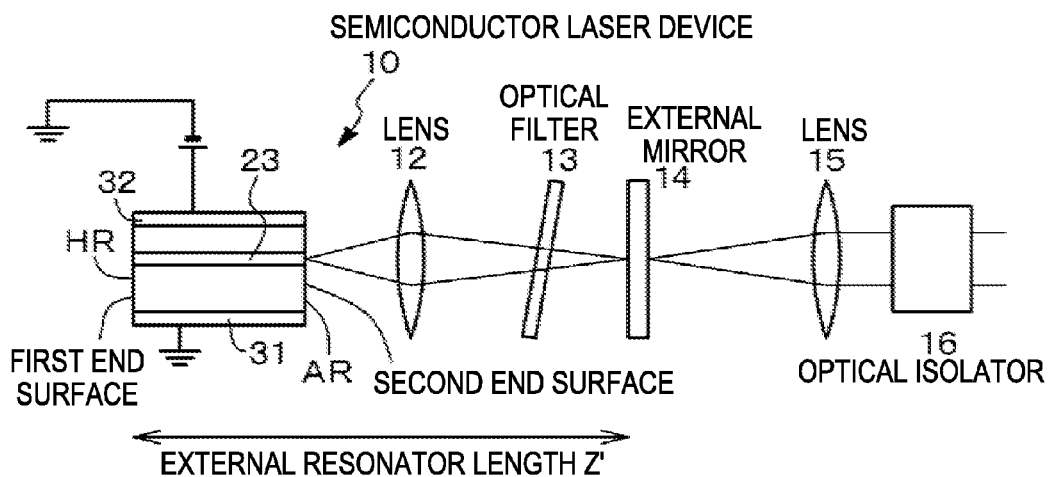
FIGS. 2A and 2B are conceptual diagrams illustrating the assembly of a semiconductor laser apparatus including the light-emitting device of the first embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, an embodiment of the present disclosure will be described with reference to the drawings. However, the present disclosure is not limited to these embodiments, and various numerical values and materials in the embodiments are merely examples. The description will be made in the following order.

1. General Configuration of Light-Emitting Device According to Embodiments of the Present Disclosure
2. First Embodiment of the Present Disclosure (Light-Emitting Device)
3. Second Embodiment (Modification of First Embodiment) and Other Embodiments In a light-emitting device according to an embodiment of the present disclosure, a first compound semiconductor layer has a layer structure obtained by sequentially growing a first clad layer and a first light guiding layer from a side of a base substrate. The thickness of the first light guiding layer is greater than 0.6 μm. A high-refractive index layer can be formed in the first light guiding layer. That is, in such a configuration, the first light guiding layer has a layer structure in which a first portion of the first light guiding layer, the high-refractive index layer, and a second portion of the first light guiding layer are deposited from the side of the base substrate. Here, to facilitate the description, the first portion of the first light guiding layer is referred to as a "first-A light guiding layer" and the second portion of the first light guiding layer is referred to as a "first-B light guiding layer."

In the light-emitting device having the preferred configuration according to the embodiment of the present disclosure, the distance (in other words, the thickness of the first-B light guiding layer) from an interface (the interface between the active layer and the first-B light guiding layer) between the active layer and the first light guiding layer to an interface between the portion (the first-B light guiding layer) of the first light guiding layer located closer to the active layer and the high-refractive index layer is preferably 0.25 μm or more. Further, an upper limit value of a value obtained by subtracting the thickness of the high-refractive index layer from the thickness of the first light guiding layer is, for example, 5 μm.

In the light-emitting device having the preferred configurations described above according to the embodiment of the present disclosure, provided that the refractive index of a compound semiconductor material of the first light guiding layer is $n_{G-1}$ and the refractive index of a compound semiconductor material of the high-refractive index layer is $n_{HR}$, "$0 < n_{HR} - n_{G-1} \leq 0.3$" may be satisfied and "$0.2 \leq n_{HR} - n_{G-1} \leq 0.2$" may be preferably satisfied. Further, provided that $n_{Ac}$ is the average refractive index of the compound semiconductor materials of the active layer, "$n_{HR} \leq n_{Ac}$" may be preferably satisfied.

The light-emitting device having the preferred configurations described above according to the embodiment of the present disclosure may output a single-mode light beam.

In the light-emitting device having the preferred configurations described above according to the embodiment of the present disclosure, provided that $LB_X$ is the size in a width direction of a ridge stripe configuration of the light beam output from a light-exit end surface of the layer structure and $LB_Y$ is the size in a thickness direction of the ridge stripe configuration, "$3 \times 10^0 \leq LB_X/LB_Y \leq 1 \times 10^3$" may be satisfied and "$1 \times 10^1 \leq LB_Y/LB_X \leq 1 \times 10^2$" may be preferably satisfied.

In the light-emitting device having the preferred configurations described above according to the embodiment of the present disclosure, provided that $Y_{CC}$ is a distance between the central point of the active layer of the layer structure and the central point of the light beam output from the layer structure in the thickness direction of the ridge stripe configuration at the light-exit end surface of the layer structure, "$0 \text{ m} < Y_{CC} \leq$ the total thickness of the first light guiding layer" may be satisfied and "$0 \text{ m} < Y_{CC} \leq$ the thickness of the first-B light guiding layer" may be preferably satisfied.

A semiconductor laser device may be configured by the light-emitting device having the preferred configurations described above according to the embodiment of the present disclosure. Alternatively, a semiconductor optical amplifier (SOA) may be configured. In this case, the light optical power of the incident light beam may be amplified twice or more and thus the amplified light beam may be outputted (or generated).

In the light-emitting device having the preferred configurations described above according to the embodiment of the present disclosure, a second compound semiconductor layer has a layer structure obtained by sequentially growing a second light guiding layer and a second clad layer from the base substrate side. The first light guiding layer may be thicker than the second light guiding layer.

In the light-emitting device having the preferred configurations described above according to the embodiment of the present disclosure, the first compound semiconductor layer, the active layer, and the second compound semiconductor layer may be formed of a GaN-based compound semiconductor. Specifically, the layer structure may be formed of an AlGaInN-based compound semiconductor. The high-refractive layer may be also formed of an AlGaInN-based compound semiconductor. More specifically, examples of the AlGaInN-based compound semiconductor include GaN, AlGaN, GaInN, and AlGaInN-based compound semiconductors. Further, these compound semiconductors may contain boron (B) atoms, thallium (Tl) atoms, arsenic (As) atoms, phosphorus (P) atoms, or antimony (Sb) atoms, silicon (Si) atoms, magnesium (Mg) atoms. The active layer has, for example, a quantum well structure. Specifically, the active layer may have a single quantum well structure [QW structure] or a multiple quantum well structure [MQW structure]. In the active layer having the quantum well structure, at least one of a well layer and a barrier layer is deposited. Examples of a combination of a compound semiconductor forming the well layer and a compound semiconductor forming the barrier layer are $(In_yGa_{(1-y)}N, GaN)$, $(In_yGa_{(1-y)}N, In_zGa_{(1-z)}N)$ (where y>z), and $(In_yGa_{(1-y)}N, AlGaN)$.

In the light-emitting device according to the embodiment of the present disclosure, the first compound semiconductor layer has a thickness greater than 0.6 μm. The upper limit value of the thickness of the first compound semiconductor layer may be, for example, 10 μm.

In the light-emitting device having the preferred configurations described above according to the embodiment of the present disclosure (hereinafter, also referred to as a light-emitting device according to an embodiment of the present disclosure), the axis line of the light-emitting device and an axis line of the ridge stripe configuration may form a predetermined angle. Here, provided that θ is a predetermined angle in the range of, for example, "0.1 degrees≤θ10 degrees." The axis line of the ridge stripe configuration is a straight line that binds the bisection point of both ends of the ridge stripe configuration in the light-exit end surface (also referred to as a "second end surface" for convenience) and the bisection point of both ends of the ridge stripe configuration in the end surface (also referred to as a "first end surface" for convenience) opposite to the light-exit end surface (second end surface). Further, the axis line of the light-emitting device refers to an axis line perpendicular to the first and second end surfaces.

Further, in the light-emitting device according to the embodiment of the present disclosure, provided that $W_2$ is the width of the ridge stripe configuration in the second end surface and $W_1$ is the width of the ridge stripe configuration, "$W_2>W_1$" is satisfied. Further, $W_2$ may be set to 5 μm or more. For example, $W_2$ may be set to $4\times10^2$ μm, although this value is not limited as the upper limit value of $W_2$. Further, $W_1$ may be set to be in the range of 0.5 μm to 10 μm. It is more preferably $W_1$ may be set to be in the range of 1.4 μm to 2.0 μm. Each end portion of the ridge stripe configuration may be formed by one line segment or may be formed by two or more line segments. In the case of the former, for example, a width of the ridge stripe configuration may be widened in a tapered shape gradually from the first end surface to the second end surface in a monotonic manner. In the case of the latter, for example, the width of the ridge stripe configuration may be initially the same from the first end surface to the second end surface and then may be widened gradually in a tapered shape in the monotonic manner. Alternatively, for example, the width of the ridge stripe configuration may be initially widened over the maximum width, and then may be narrowed from the first end surface to the second end surface.

When a semiconductor optical amplifier is configured by the light-emitting device according to the embodiment of the present disclosure, a laser light source generating a laser beam to be incident on the semiconductor optical amplifier may be configured by a mode locked semiconductor laser device, and thus a pulsed laser beam output from the mode locked semiconductor laser device may be incident on the semiconductor optical amplifier. In this case, the laser light source may be configured to output a pulsed laser beam based on a mode locked operation. The mode locked semiconductor laser device may be configured by the light-emitting device according to the embodiment of the present disclosure. However, the laser light source is not limited thereto. Continuous oscillation type laser light sources according to the related art, pulse oscillation type laser light sources of various types such as a gain switching type or a loss switching type (Q switching type) according to the related art, or laser light sources of titanium sapphire laser may be used. Further, since the semiconductor optical amplifier directly amplifies light without converting an optical signal into an electrical signal, the semiconductor optical amplifier has a laser structure in which a resonator effect is excluded as far as possible and amplifies incident light with an optical gain of the semiconductor optical amplifier.

When a semiconductor optical amplifier is configured by the light-emitting device according to the embodiment of the present disclosure, the light intensity of the laser beam output from the semiconductor optical amplifier is not particularly limited, but may be set to 60 kilowatts or more per 1 $cm^2$ of the active layer forming the light-exit end surface and may be preferably set to 600 kilowatts or more per 1 $cm^2$ of the active layer. Further, the semiconductor optical amplifier may be configured by a transmissive semiconductor optical amplifier, but the embodiment of the present disclosure is not limited thereto. For example, the semiconductor optical amplifier may be configured by a monolithic type semiconductor optical amplifier in which a semiconductor laser device and a semiconductor optical amplifier are integrated.

When a semiconductor laser device is configured by the light-emitting device according to the embodiment of the present disclosure, the semiconductor laser device may further include an external mirror (external reflection mirror). That is, the semiconductor laser device may be configured as an external resonator type semiconductor laser device. Alternatively, the semiconductor laser device may be also configured as a monolithic type semiconductor laser device. Further, the external resonator type semiconductor laser device may be a focusing type or collimated type semiconductor laser device. In the external resonator type semiconductor laser device, a light reflectivity of one end surface of the layer structure from which the light beam (light pulse) is output is preferably 0.5% or less. Further, the value of this light reflectivity is considerably lower than a light reflectivity (generally 5% to 10%) of one end surface of the layer structure from which the light beam (light pulse) is output in a semiconductor laser device according to the related art. In the external resonator type semiconductor laser device, the value of the length of an external resonator (Z', unit: μm) may be in the range of "0<Z'<1500" and may be preferably in the range of "30≤Z'≤150."

When a semiconductor laser device is configured by the light-emitting device according to the embodiment of the present disclosure, a low-reflection coating layer may be formed at least on one end surface. Further, when the semiconductor optical amplifier is configured by the light-emitting device according to the embodiment of the present disclosure, a low-reflection coating layer may be formed on each of the first and second end surfaces. Here, the low-reflection coating layer has a layer structure of at least two kinds of layers selected from a group of, for example, a titanium oxide layer, a tantalum oxide layer, a zirconium oxide layer, a silicon oxide layer, and an aluminum oxide layer.

In the light-emitting device according to the embodiment of the present disclosure, a second electrode is formed on the second compound semiconductor layer. Here, the second electrode may be configured by a single palladium (Pd) layer, a single nickel (Ni) layer, a single platinum (Pt) layer, a layer structure which includes a platinum layer and a palladium layer which comes into contact with the second compound semiconductor layer, or a layer structure which includes a nickel layer and a palladium layer which comes into contact with the second compound semiconductor layer. Further, when a lower metal layer is formed of palladium and an upper metal layer is formed of nickel, the thickness of the upper metal layer may be set to 0.1 μm or more and may be preferably set to 0.2 μm or more. Further, the second electrode is preferably configured by a single palladium (Pd) layer. In this case, the thickness of the second electrode is 20 nm or more and is preferably 50 nm or more. The width of the second electrode is appropriately set in consideration of the width of the stripe configuration.

When a first conductivity type is an n-type, a first electrode electrically connected to the first compound semiconductor layer of the n-conductivity type preferably has a single-layer structure containing at least one kind of metal selected from the group of gold (Au), silver (Ag), palladium (Pd), aluminum (Al), titanium (Ti), tungsten (W), copper (Cu), zinc (Zn), tin (Sn), and indium (In), or a multi-layer structure thereof Examples of the multi-layer structure include Ti/Au, Ti/Al, or Ti/Pt/Au. The first electrode is electrically connected to the first compound semiconductor layer. However, the first electrode may be formed on the first compound semiconductor layer or may be connected to the first compound semiconductor layer via a conductive material layer or a conductive base substrate. The first or second electrode can be formed by, for example, a vacuum evaporation method or a sputtering method.

A pad electrode may be formed on the first electrode or the second electrode to be electrically connected to an external electrode or circuit. The pad electrode preferably has a single-layer structure containing at least one kind of metal selected from the group of titanium (Ti), aluminum (Al), gold (Au), platinum (Pt), and nickel (Ni) or a multi-layer structure thereof Alternatively, the pad electrode has a multi-layer structure of, for example, Ti/Pt/Au or Ti/Au.

In the light-emitting device according to the embodiment of the present disclosure, the second compound semiconductor layer has a superlattice structure in which a p-type GaN layer and a p-type AlGaN layer are alternately deposited. The thickness of the superlattice structure is 0.7 μm or less. When such a superlattice structure is used, a series resistance component of the light-emitting device can be lowered while maintaining a refractive index necessary for the clad layer. Thus, an operation voltage of the light-emitting device can be accordingly lowered. A lower limit of a thickness of the superlattice structure is, for example, 0.3 μm. However, the lower limit value is not limited thereto. For example, the thickness of the p-type GaN layer forming the superlattice structure may be in the range of 1 nm to 5 nm, the thickness of the p-type AlGaN layer forming the superlattice structure may be in the range of 1 nm to 5 nm, and a total number of layers of the p-type GaN layers and p-type AlGaN layers may be in the range of 60 to 300. Further, a distance between the active layer and the second electrode is 1 μm or less and is preferably 0.6 μm or less. When the distance between the active layer and the second electrode is regulated, the operation voltage of the light-emitting device can be achieved by thinning the thickness of the p-type second compound semiconductor layer with high resistance. Further, a lower limited of a distance between the active layer and the second electrode is, for example, 0.3 μm. However, the lower limit value is not limited thereto. Furthermore, the second compound semiconductor layer is doped with Mg of $1 \times 10^{19}$ $cm^{-3}$ or more and an absorption coefficient of the second compound semiconductor layer with respect to light with a wavelength of 405 nm from the active layer may be at most 50 $cm^{-1}$. The atomic concentration of Mg is derived from a material property that shows the maximum hole concentration of $2 \times 10^{19}$ $cm^{-3}$ and results from the fact that the maximum hole concentration, that is, the specific resistance of the second compound semiconductor layer, is designed to have the minimum value. The absorption coefficient of the second compound semiconductor layer is regulated from the viewpoint that the resistance of the light-emitting device is lowered to be as small as possible. The doping amount of Mg can be deliberately set to have a concentration of $2 \times 10^{19}$ $cm^{-3}$ or more. In this case, an upper limit of the doping amount of Mg by which a practical hole concentration can be obtained is, for example, $8 \times 10^{19}$ $cm^{-3}$. Further, the second compound semiconductor layer may include a non-doped compound semiconductor layer and a p-type compound semiconductor layer from the side of the active layer. The distance between the active layer and the p-type compound semiconductor layer may be set to $1.2 \times 10^{-7}$ m or less. When the distance between the active layer and the p-type compound semiconductor layer is regulated, the internal loss can be suppressed within the range in which the internal quantum efficiency does not deteriorate. Thus, for example, a threshold value $I_{th}$ at which laser oscillation starts can be reduced. Further, the distance between the active layer and the p-type compound semiconductor layer is not limited to the lower limit value, but may be set, for example, $5 \times 10^{-8}$ m. A layer insulation film having $SiO_2$/Si layer structures is formed on both sides of the ridge stripe structure. A difference between the effective refractive index of the ridge stripe structure and the effective refractive index of the layer insulation film may be set to be in the range of $5 \times 10^{-3}$ to $1 \times 10^{-2}$. When the layer insulation film is used, a single fundamental lateral mode can be maintained even in a high-output operation performed at the output greater than 100 mW. The thickness of the p-type light guiding layer is preferably 100 nm or less. A band gap of the compound semiconductor forming a well layer in the active layer is preferably 2.4 eV or more. The wavelength of the light output from the active layer may be in the range of 360 nm to 550 nm and may be preferably in the range of 400 nm to 410 nm. Here, the various configurations described above may, of course, be appropriately combined.

As described above, in the second compound semiconductor layer, a non-doped compound semiconductor layer (for example, a non-doped GaInN layer or a non-doped AlGaN layer) may be formed between the active layer and an electronic barrier layer. Further, a non-doped GaInN layer may be formed as a light guiding layer between the active layer and the non-doped compound semiconductor layer. The uppermost layer of the second compound semiconductor layer may be occupied by an Mg-doped GaN layer (p-type contact layer).

In the light-emitting device according to the embodiment of the present disclosure, various compound semiconductor layers (for example, GaN-based compound semiconductor layers) are sequentially formed on the base substrate. Here, examples of the base substrate include not only the sapphire substrate but also a GaAs substrate, a GaN substrate, a SiC substrate, an alumina substrate, a ZnS substrate, a ZnO substrate, an MN substrate, a LiMgO substrate, a LiGaO$_2$ substrate, a MgAl$_2$O$_4$ substrate, an InP substrate, a Si substrate, or a substrate including an underlying layer or a buffer layer in the surface (main surface) thereof. The reason for preferentially forming the GaN-based compound semiconductor layer on the substrate is that the defect density of a GaN substrate is small. However, polar, non-polar, and semipolar characteristics are known to be changed on a growth surface of the GaN substrate. Further, a metal-organic chemical vapor deposition method (an MOCVD method or an MOVPE method), a molecular beam epitaxy method (an MBE method), a hydride vapor deposition method in which halogen contributes to transportation or reaction, or the like may be used as a method of forming the various compound semiconductor layers (for example, GaN-based compound semiconductor layers) of the light-emitting device according to the embodiment of the present disclosure.

In the MOCVD method, for example, trimethylgallium (TMG) gas or triethylgallium (TEG) gas can be used as an organic gallium source gas and ammonia gas or hydrazine gas can be used as a nitrogen source gas. When a GaN-based compound semiconductor layer of an n-conductivity type is formed, for example, silicon (Si) may be added as n-type impurities (n-type dopant). When a GaN-based compound semiconductor layer of a p-conductivity type is formed, for example, magnesium (Mg) may be added as p-type impurities (p-type dopant). When aluminum (Al) or indium (In) is included as constituent atoms of the GaN-based compound semiconductor layer, trimethylaluminum (TMA) gas may be used as an Al source and trimethylindium (TMI) gas may be used as an In source. Further, monosilane gas (SiH$_4$ gas) may be used as Si source. Cyclopentadienyl magnesium gas, methylcyclopentadienyl magnesium gas, or biscyclopentadienyl magnesium (Cp$_2$Mg) gas may be used as a Mg source. Furthermore, examples of the n-type impurities (n-type dopant) include Ge, Se, Sn, C, Te, S, O, Pd, and Po in addition to Si. Examples of the p-type impurities (p-type dopant) include Zn, Cd, Be, Ca, Ba, C, Hg, and Sr in addition to Mg.

In the light-emitting device according to the embodiment of the present disclosure, the layer structure has a ridge stripe configuration formed of at least a part of the second compound semiconductor layer in the thickness direction of the second compound semiconductor layer. However, the ridge stripe configuration may be formed by only the second compound semiconductor layer, may be formed by the second compound semiconductor layer and the active layer, or may be formed by the second compound semiconductor layer, the active layer, and a part of the second compound semiconductor layer in the thickness direction. When the ridge stripe configuration is formed, the compound semiconductor layer may be patterned through, for example, dry etching.

The light-emitting device according to the embodiment of the present disclosure can be applied to fields such as optical disc systems, a communication field, an optical information field, opto-electronic integrated circuits, a field in which a non-linear optical phenomenon is applied, optical switches, a laser measurement field or various analysis fields, an ultrafast spectroscopy field, a multiphoton-excited spectroscopy field, a mass spectrometry field, a microspectroscopic field in which multiphoton absorption is used, quantum control of chemical reaction, a nano three-dimensional processing field, various processing fields in which multiphoton absorption is applied, a medical field, and a bio-imaging field.

First Embodiment

A first embodiment of the present disclosure relates to a light-emitting device. Specifically, the light-emitting device according to the first embodiment is a semiconductor laser device. FIG. 1 is a schematic partial sectional view illustrating the semiconductor laser device when the semiconductor laser device is cross-sectioned along a virtual plane perpendicular to an axis line of the light-emitting device. As shown in FIG. 1, the light-emitting device includes: (a) a layer structure 20 in which a first compound semiconductor layer 21 of a first conductivity type, an active layer (a light emission region and a gain region) 23 formed of a compound semiconductor, and a second compound semiconductor layer 22 of a second conductivity type different from the first conductivity type are sequentially deposited on a base substrate 20'; (b) a second electrode 32 formed on the second compound semiconductor layer 22; and (c) a first electrode 31 electrically connected to the first compound semiconductor layer 21.

The light-emitting device according to the first embodiment has a ridge stripe type separate confinement heterostructure (SCH structure). The layer structure 20 has a ridge stripe configuration 20A formed of at least a part of the second compound semiconductor layer in the thickness direction of the second compound semiconductor layer. The first compound semiconductor layer 21 has a thickness greater than 0.6 µm. A high-refractive index layer 24 formed of a compound semiconductor material having a refractive index higher than the refractive index of a compound semiconductor material of the first compound semiconductor layer 21 is formed in the first compound semiconductor layer 21. Specifically, the first compound semiconductor layer 21 has a layer structure obtained by sequentially growing a first clad layer 121A and a first light guiding layer 121B from the side of the base substrate. The first light guiding layer 121B has a thickness greater than 0.6 µm. The high-refractive index layer 24 is formed in the first light guiding layer 121B. Here, the first light guiding layer 121B has a layer structure in which a first portion (first-A light guiding layer 121B$_1$) of the first light guiding layer, the high-refractive index layer 24, and a second portion (first-B light guiding layer 121B$_2$) of the first light guiding layer are deposited from the side of the base substrate.

The total thickness of the first light guiding layer 121B including the high-refractive index layer 24 is set to 1.25 µm. Further, a distance from an interface (the interface between the active layer 23 and the first-B light guiding layer 121B$_2$) between the active layer 23 and the first light guiding layer 121B to an interface between the portion (the first-B light guiding layer 121B$_2$) of the first light guiding layer 121B located closer to the active layer and the high-refractive index layer 24 is 0.25 µm or more. In the first embodiment, specifically, this distance is set to 0.35 µm. That is, the thickness of the first-B light guiding layer 121B$_2$ is set to 0.35 µm. The high-refractive index layer 24 is formed of an In$_{0.02}$Ga$_{0.98}$N with a thickness of 50 nm. Provided that a refractive index of a compound semiconductor material of the first light guiding layers 121B$_1$ and 121B$_2$ is n$_{G-1}$, a refractive index of a compound semiconductor material of the high-refractive index layer 24 is n$_{HR}$, and an average refractive index of the compound semiconductor material of the active layer 23 is n$_{Ac}$, "0<n$_{HR}$−n$_{G-1}$≤0.3" is satisfied and "0.02≤n$_{HR}$−n$_{G-1}$≤0.2" is preferably satisfied. Further, "n$_{HR}$≤n$_{Ac}$" is satisfied. Specifically, n$_{HR}$ is equal to 2.547, n$_{G-1}$ is equal to 2.520, and n$_{Ac}$ is equal to 2.620.

Further, the length and width of the ridge stripe structure 20A are set to 1.0 mm and 1.6 µm, respectively. The light-emitting device outputs a single-mode light beam.

Specifically, the base substrate 20' is configured by an n-type GaN substrate and the compound semiconductor layer is formed on the (0001) plane of the n-type GaN substrate. The (0001) plane of the n-type GaN substrate is a crystalline plane that is called a "C plane" and has a polarity. The layer structure 20 including the first compound semiconductor layer 21, the active layer 23, and the second compound semiconductor layer 22 is formed of a GaN-based compound semiconductor. Specifically, the layer structure 20 is formed of an AlGaInN-based compound semiconductor. More specifically, the layer structure 20 has layers shown in Table 1 below. In Table 1, as the compound semiconductor layers are shown in the lower layer, the compound semiconductor layers are closer to the base substrate 20'. A band gap of the compound semiconductor forming the well layer in the active layer 23 is 3.06 eV. The active layer 23 has a quantum well structure that includes a well layer and a barrier layer. A doping concentration of the impurities (specifically, silicon (Si)) of the barrier layer is in the range of $2 \times 10^{17}$ cm$^{-3}$ to $1 \times 10^{20}$ cm$^{-3}$. Layer insulation films 25 formed of SiO$_2$/Si are formed on both sides of the ridge stripe configuration 20A. Further, the SiO$_2$ layer is the lower layer and the Si layer is an upper layer. A second electrode (p-side ohmic electrode) 32 is formed in the p-type GaN contact layer 122D corresponding to a top plane of the ridge stripe configuration 20A. On the other hand, a first electrode (n-side ohmic electrode) 31 formed of Ti/Pt/Au is formed on a rear surface of the base substrate 20'. In this embodiment, the second electrode 32 is formed by a single Pd layer with a thickness of 0.1 µm. A p-type AlGaN electronic barrier layer 122A has a thickness of 10 nm. A second light guiding layer (p-type AlGaN layer) 122B has a thickness of 50 nm. A second clad layer (p-type AlGaN layer) 122C has a thickness of 0.5 µm. The p-type GaN contact layer 122D has a thickness of 100 nm. Further, the p-type AlGaN electronic barrier layer 122A, the second light guiding layer 122B, the second clad layer 122C, and the p-type GaN contact layer 122D of the second compound semiconductor layer 22 are doped with Mg of $1 \times 10^{19}$ cm$^{-3}$ or more (specifically, $2 \times 10^{19}$ cm$^{-3}$). On the other hand, the first clad layer (n-type AlGaN layer) 121A has a thickness of 2.5 µm. The total thickness of the first light guiding layer (n-type GaN layer) 121B including the high-refractive index layer 24 is 1.25 µm, as described above. The total thickness (1.25 µm) of the first light guiding layer 121B is greater than the thickness (100 nm) of the second light guiding layer 122B. Further, the first light guiding layer 121B is formed of GaN. The first light guiding layer 121B may be also formed of a compound semiconductor with a band gap wider than the band gap of the active layer 23 and narrower than the band gap of the first clad layer 121A.

[Table 1]
Second Compound Semiconductor Layer 22
P-type GaN Contact Layer (doped with Mg) 122D
Second Clad Layer (p-type Al$_{0.05}$Ga$_{0.95}$N layer (doped with Mg)) 122C
Second Light Guiding Layer (p-type Al$_{0.01}$Ga$_{0.99}$N layer (doped with Mg))
P-type Al$_{0.20}$Ga$_{0.80}$N Electronic Barrier Layer (doped with Mg) 122A
Active Layer 23
GaInN Quantum Well Active Layer 23
(well layer: Ga$_{0.92}$In$_{0.08}$N/barrier layer: Ga$_{0.98}$In$_{0.02}$N)
First Compound Semiconductor Layer 21
First-B Light Guiding Layer (n-type GaN light guiding Layer) 121B$_2$
High-refractive Index Layer (n-type In$_{0.02}$Ga$_{0.98}$N high-refractive index layer) 24
First-A Light Guiding Layer (n-type GaN layer) 121B$_1$
First Clad Layer (n-type Al$_{0.03}$Ga$_{0.97}$N layer) 121A, where Well Layers (two layers): 10 nm [non-doped] Barrier Layers (three layers): 12 nm.

Figure 4:
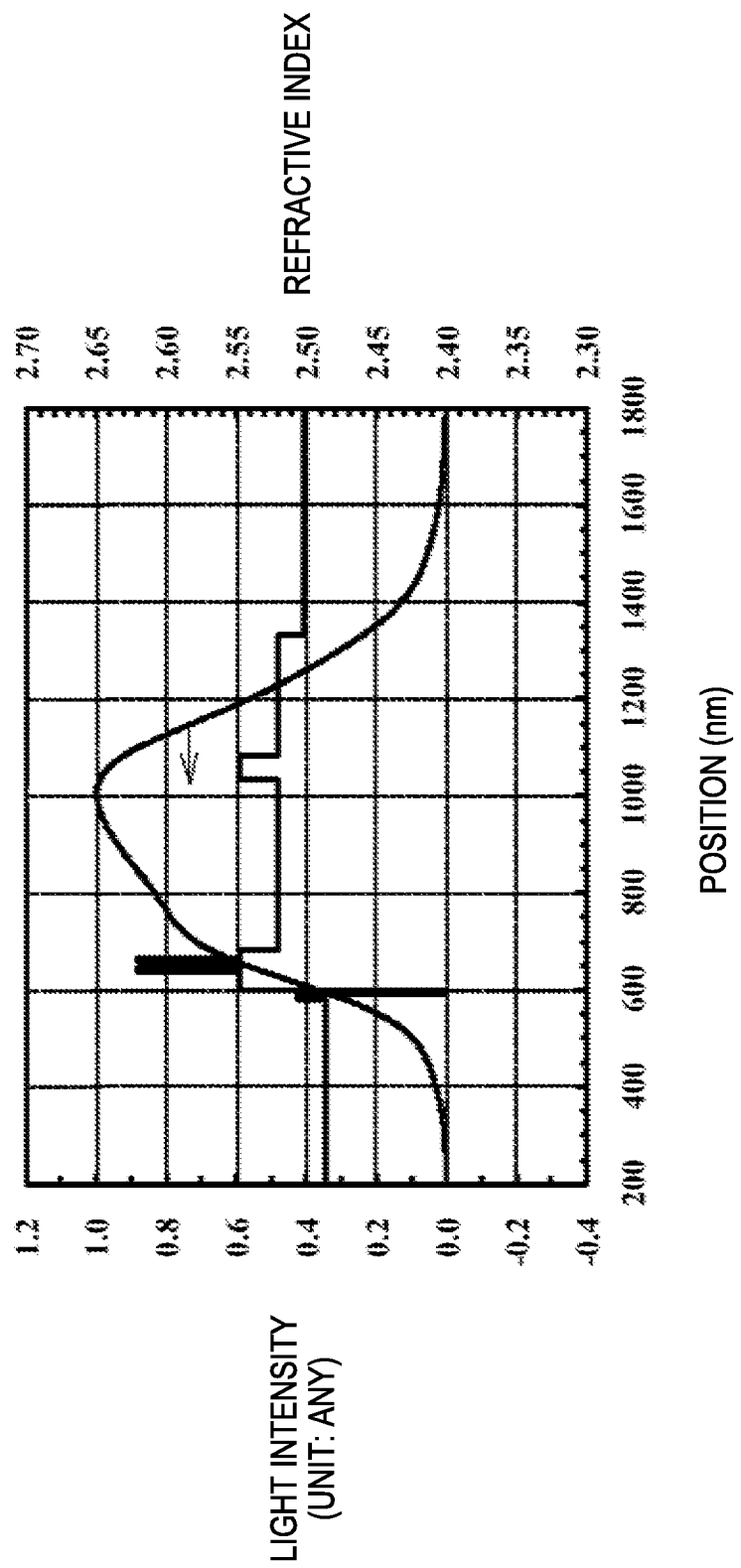
FIG. 4 is a graph illustrating a calculation result of a profile of a refractive index distribution and a light field intensity in a layer structure of the light-emitting device of the first embodiment.
Figure 5:
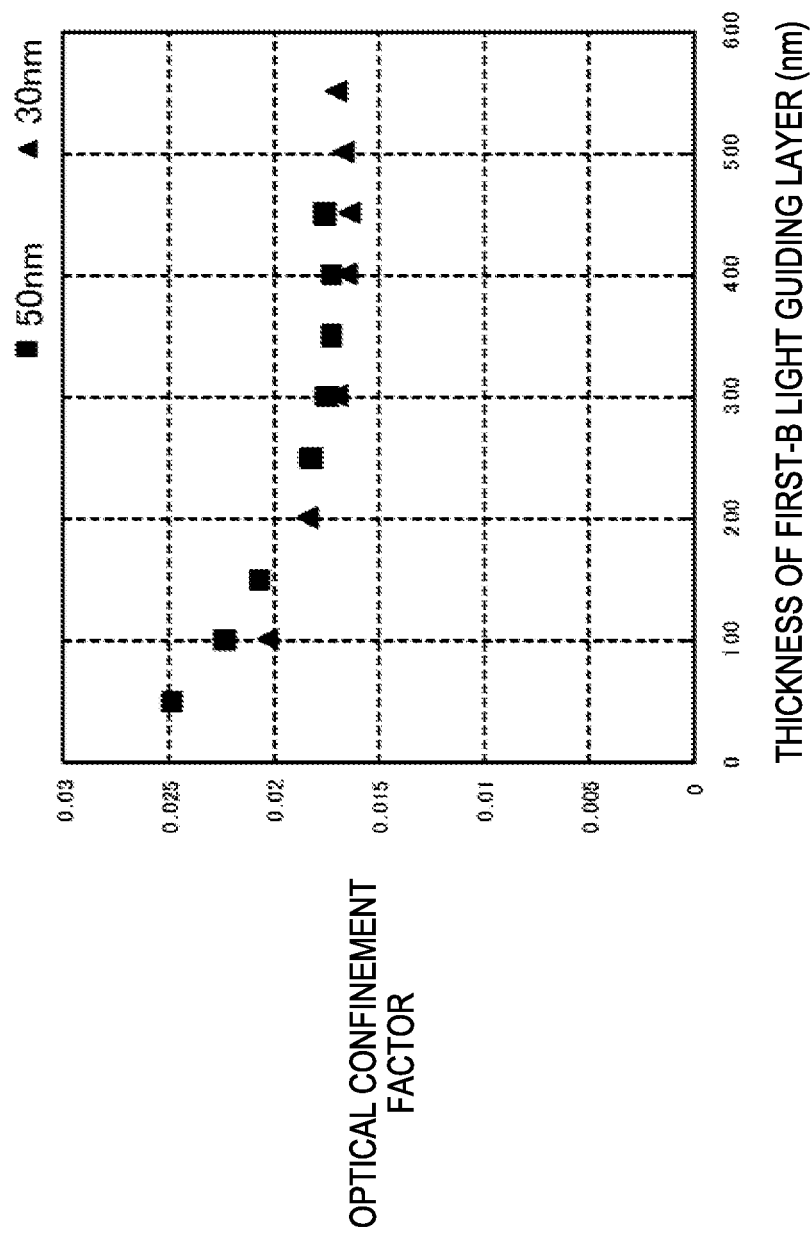
FIG. 5 is a graph illustrating a calculation result of an optical confinement factor when the thickness of a high-refractive index layer is 30 nm and 50 nm and the thickness of a first-B light guiding layer is changed.
Figure 6A:
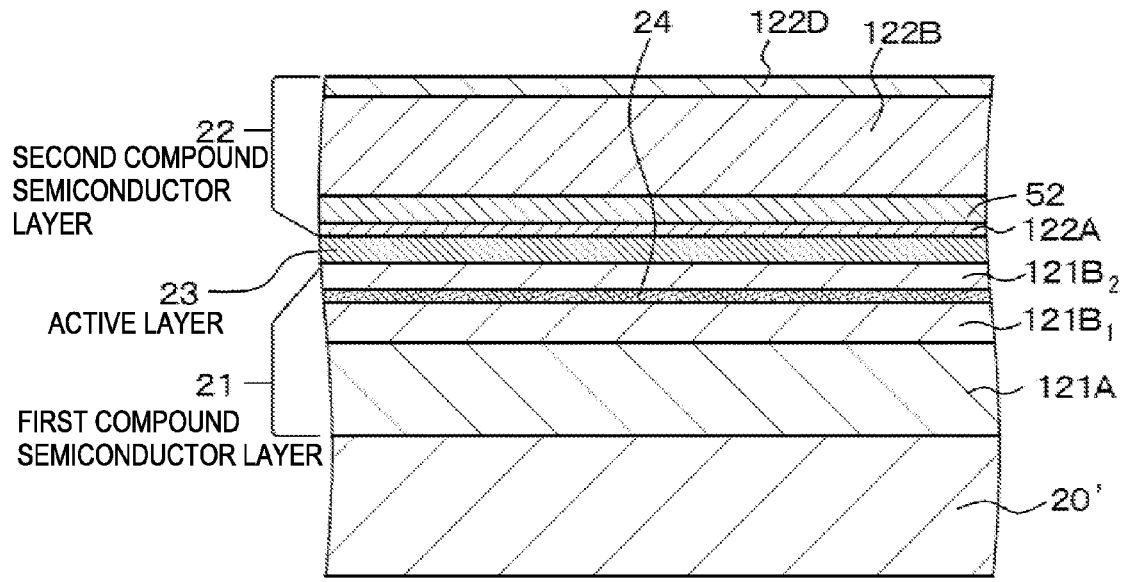
FIGS. 6A and 6B are schematic partial sectional views of a base substrate and the like when the light-emitting device is cross-sectioned along the virtual plane perpendicular to an axis line of the light-emitting device in a method of manufacturing the light-emitting device of the first embodiment.
Figure 6B:
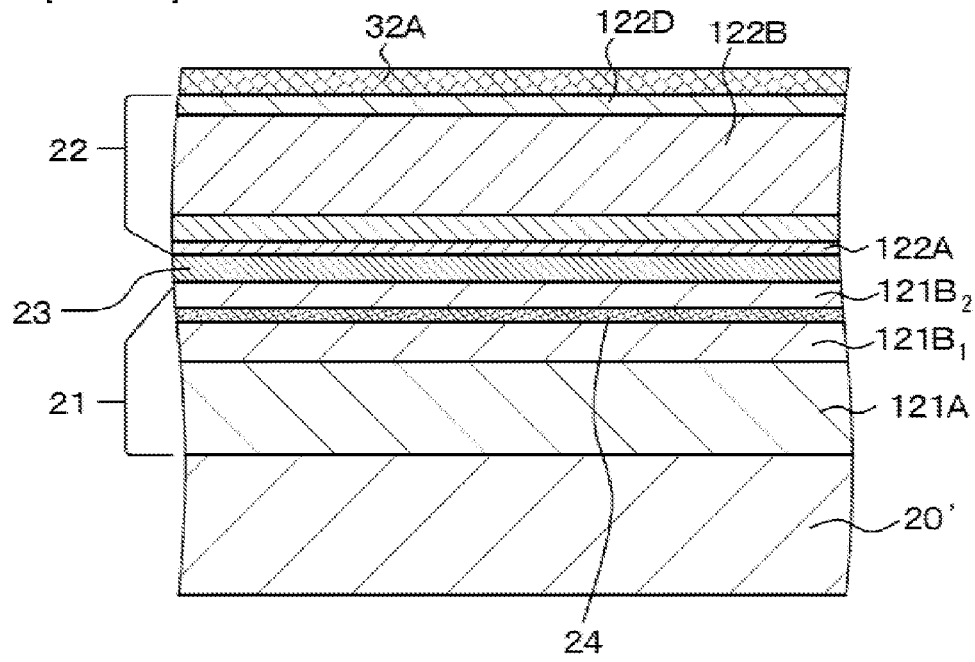
Figure 7A:
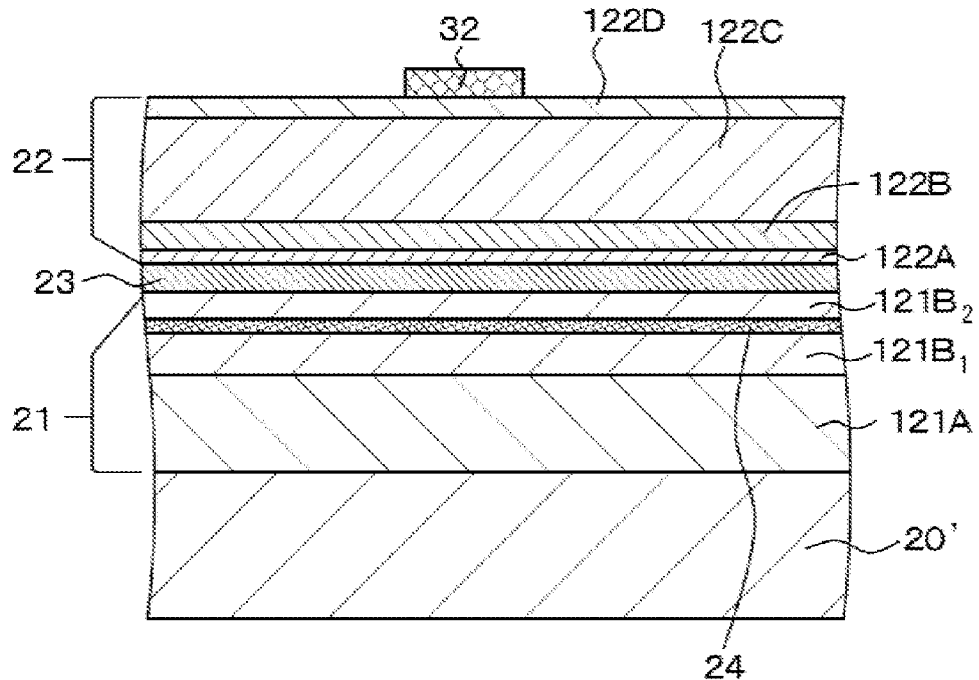
FIGS. 7A and 7B are schematic partial sectional views of the base substrate and the like when the light-emitting device is cross-sectioned along the virtual plane perpendicular to an axis line of the light-emitting device in the method of manufacturing the light-emitting device of the first embodiment in FIG. 6B.
Figure 7B:
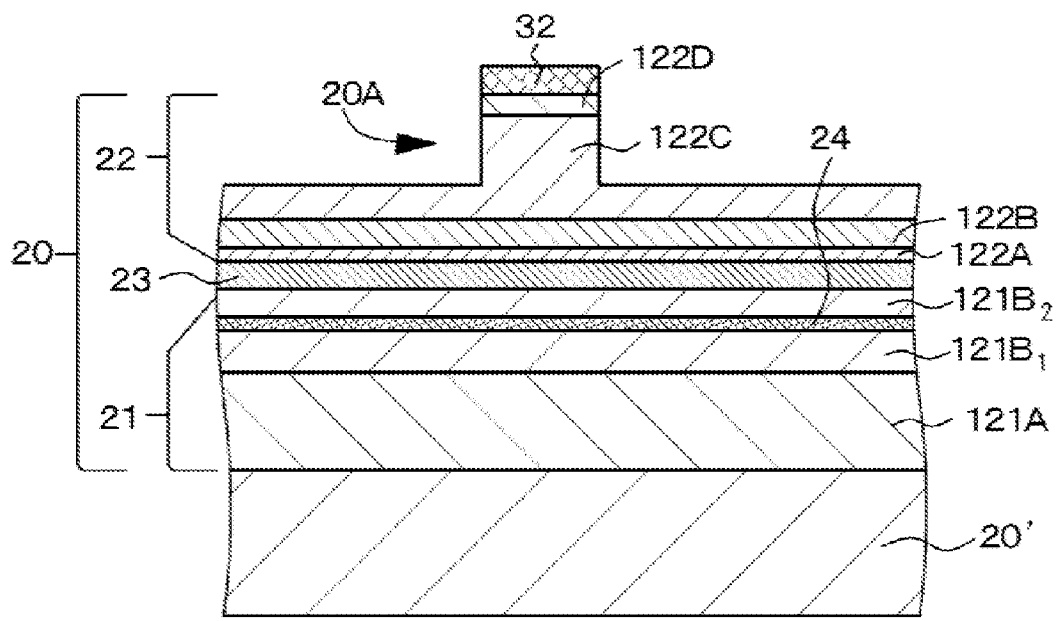
Figure 10:
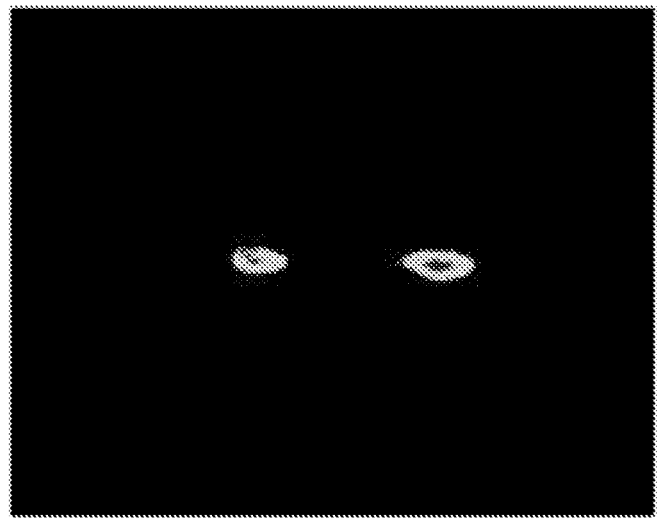
FIG. 10 is a diagram illustrating a near-field pattern that shows a multi-beam shape when the thickness of an n-type compound semiconductor layer is greater than 0.6 μm in a semiconductor laser device according to the related art and thus the mode of a light beam is not a single mode.

FIG. 4 shows a calculation result of a profile of a refractive index distribution and a light field intensity in the second clad layer 122C, the second light guiding layer 122B, the p-type AlGaN electronic barrier layer 122A, the active layer 23, the first-B light guiding layer 121B$_2$, the high-refractive index layer 24, the first-A light guiding layer 121B$_1$, and the first clad layer 121A. It can be understood that the light field intensity is moved toward the first clad layer 121B due to the presence of the high-refractive index layer 24. In FIG. 4, the horizontal axis represents a distance from an interface between the p-type GaN contact layer (doped with Mg) 122D and the second electrode 32. FIG. 5 shows a calculation result of an optical confinement factor when the thickness of the high-refractive index layer 24 is 30 nm and 50 nm and the thickness of the first-B light guiding layer 121B$_2$ is changed. From FIG. 5, it can be understood that a low optical confinement factor is realized when the thickness of the first-B light guiding layer 121B$_2$ is set to 0.25 µm or more. Further, various analysis results have proved that the thickness of the high-refractive index layer 24 is preferably 50 nm or less since multiple beams of a light beam output from the light-emitting device are reliably suppressed, and moreover an atomic percentage of In in the high-refractive index layer 24 is preferably less than 5% since multiple beams of a light beam output from the light-emitting device are reliably suppressed.

FIG. 2A shows a concept of the assembly of a semiconductor laser apparatus including the light-emitting device according to the first embodiment. The semiconductor laser apparatus assembly shown in FIG. 2A is an external resonator type apparatus. That is, the semiconductor laser apparatus assembly according to the first embodiment includes a semiconductor laser device 10 serving as the light-emitting device according to the first embodiment, a lens 12, an optical filter 13, an external mirror 14, and a lens 15. A laser beam output from a laser light source is output to the outside via an optical isolator 16. For example, an anti-reflection coating layer (AR) having a layer structure of a single titanium oxide layer and a single aluminum oxide layer is formed on a second end surface which is the light-exit end surface of the semiconductor laser device 10. Further, a high-reflection coating layer (HR) is formed on a first end surface facing the second end surface. An external resonator is formed by the first end surface of the semiconductor laser device 10 and the external mirror 14. As described above, a light beam is drawn from the external mirror 14. A bandpass filter is mainly used as the optical filter 13 and is inserted to control the oscillation wavelength of a laser. A repetition frequency f of a light pulse line is determined depending on an external resonator length Z' and is expressed as in the following equation. In this equation, c denotes the velocity of light and n denotes a refractive index of a waveguide. Here, the value of the external resonator length (Z', unit: mm) is set to 100 mm. Further, a light reflectivity of the second end surface of the layer structure 20 from which the light beam (light pulse) is output is 0.5% or less (for example, 0.3%). The light reflectivity of the first end surface of the layer structure 20 from which the light beam is output is, for example, equal to or greater than 85% and less than 100% (for example, 95%). Furthermore, the light transmittance of the optical filter 13 is, for example, equal to or greater than 85% and less than 100% (for example, 90%). A half-value width is, for example, greater than 0 nm and equal to or less than 2 nm (for example, 1 nm). A peak wavelength is, for example, equal to or greater than 400 nm and equal to or less than 450 nm (for example, 410 nm). The light reflectivity of the external mirror 14 is greater than 0% and less than 100% (for example, 20%). The values of the various parameters mentioned here are merely examples, and thus can, of course, be appropriately modified.

$$f=c/(2n\cdot Z')$$

Figure 2B:
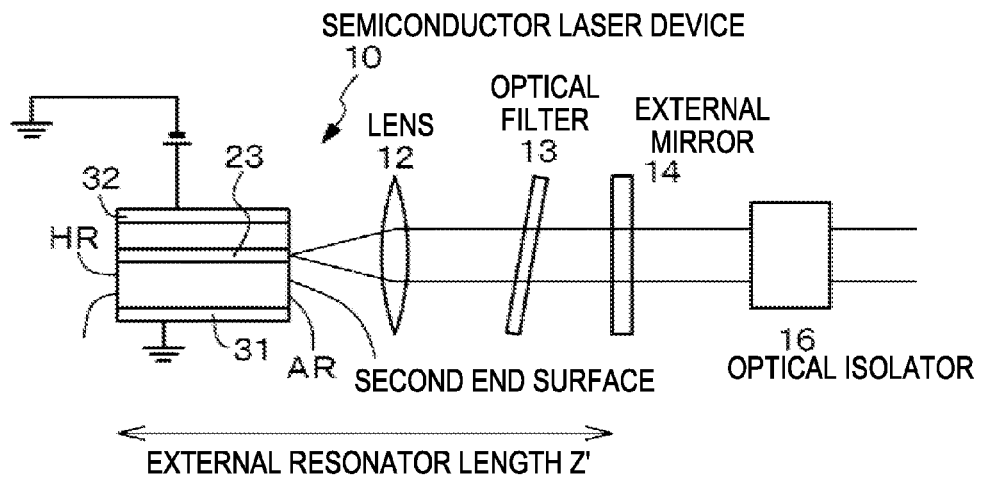

Even in a collimated type external resonator shown in FIG. 2B, an external resonator is also formed by an external mirror 14 and the end surface of the semiconductor laser device on which a high-reflection coating layer (HR) is formed. Thus, a light beam is drawn from the external mirror 14.

Figure 3A:
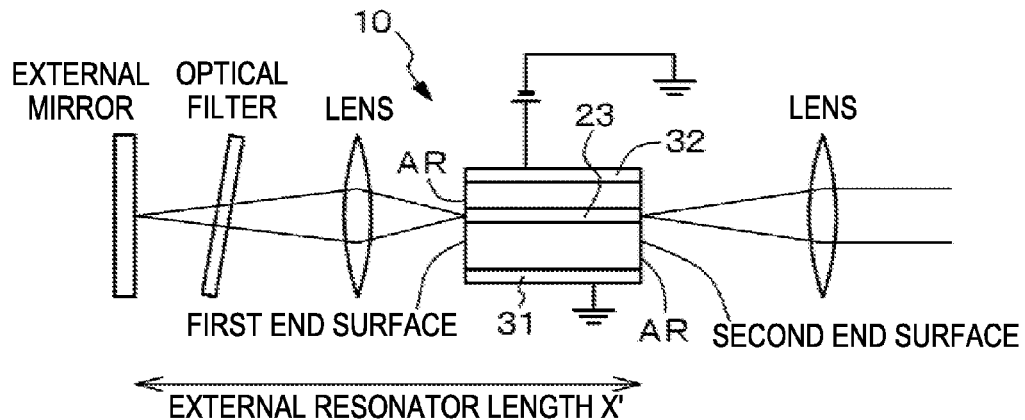
FIGS. 3A to 3C are conceptual diagrams illustrating the assembly of another semiconductor laser apparatus including the light-emitting device of the first embodiment.
Figure 3B:
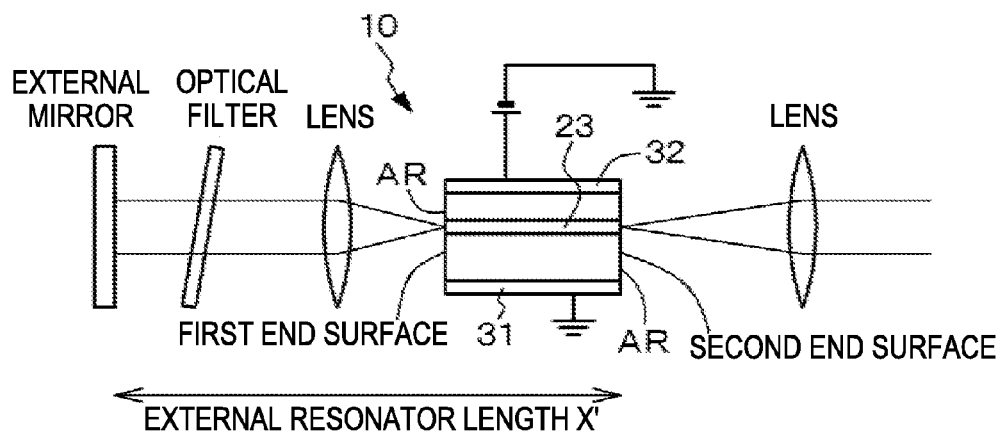
Figure 3C:
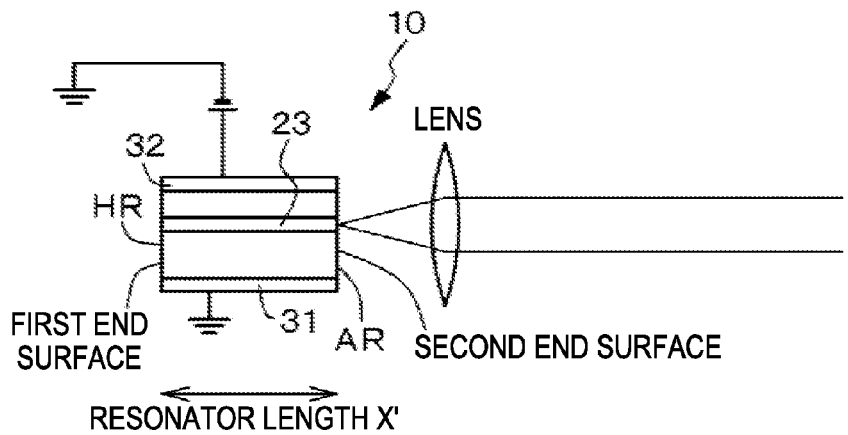

In external resonators shown in FIGS. 3A and 3B, each external resonator is formed by an external mirror and the second end surface of the semiconductor laser device. Thus, a light beam is drawn from the semiconductor laser device. An anti-reflection coating layer (AR) is formed on the second end surface. FIG. 3A shows an example of a focusing type external resonator and FIG. 3B shows an example of a collimated type external resonator. Further, as shown in FIG. 3C, a monolithic type semiconductor laser device may be configured.

Hereinafter, a method of manufacturing the light-emitting device of the first embodiment will be described with reference FIGS. 6A, 6B, 7A, and 7B which are schematic partial sectional diagrams.

[Step-100]

First, the layer structure 20 is formed on the base substrate 20', specifically, on the (0001) plane of the n-type GaN substrate through a known MOCVD method. In the layer structure 20, the first compound semiconductor layer 21 (including the high-refractive index layer 24) of a first conductivity type (n-type) formed of a GaN-based compound semiconductor, the active layer (a light emission region and a gain region) 23 formed of a GaN-based compound semiconductor, and the second compound semiconductor layer 22 of the second conductivity type (p-type) different from the first conductivity type formed of a GaN-based compound semiconductor are sequentially deposited (see FIG. 6A).

[Step-110]

Next, the ridge stripe configuration 20A is formed by etching a part of the second compound semiconductor layer 22 in the thickness direction through dry etching. Specifically, the strip-shaped second electrode 32 is first formed on the second compound semiconductor layer 22. More specifically, a Pd layer 32A is formed on the entire surface on the second compound semiconductor layer 22 through a vacuum evaporation method (see FIG. 6B), and then a strip-shaped etching resist layer is formed on the Pd layer 32A through a photolithography technique. Then, the Pd layer 32A not covered with the etching resist layer is removed using an aqua regia, and then the etching resist layer is removed. Thus, a structure shown in FIG. 7A can be obtained. Further, the strip-shaped second electrode 32 may be formed on the second compound semiconductor layer 22 through a liftoff technique.

Provided that an etching rate of the second electrode 32 is $ER_0$ and an etching rate of the layer structure 20 in the process of patterning the second electrode 32 is $ER_1$, "$ER_0/ER_1 \geq 1\times 10$" is satisfied and "$ER_0/ER_1 \geq 1\times 10^2$" is preferably satisfied. When "$ER_0/ER_1$" satisfies such a relation, the second electrode 32 can reliably be patterned without etching the layer structure 20 (or by slightly etching the layer structure 20).

[Step-120]

Then, the ridge stripe configuration 20A is formed by etching a part of the second compound semiconductor layer 22 in the thickness direction through dry etching using the second electrode 32 as an etching mask. Specifically, the part of the second compound semiconductor layer 22 is etched through an RIE technique with $Cl_2$ gas using the second electrode 32 as the etching mask. Thus, a structure shown in FIG. 7B can be obtained. Accordingly, since the ridge stripe configuration 20A is formed through self-alignment method using the second electrode 32 patterned in the strip shape as the etching mask, a deviation between the second electrode 32 and the ridge stripe configuration 20A is restrained.

[Step-130]

Next, the layer insulation films 25 are formed and the layer insulation films 25 on the second electrode 32 are removed. The first electrode 31 is formed, wall cleaving or the like of the substrate is performed, and then packaging is performed to produce the light-emitting device according to the first embodiment.

After [Step-100], the ridge stripe configuration 20A may be formed without forming the second electrode 32, [step-120] may be performed, the second electrode 32 may be formed, and then [Step-130] may be performed.

In the light-emitting device according to the first embodiment, the first compound semiconductor layer has a thickness greater than 0.6 μm. The high-refractive index layer formed of the compound semiconductor material having a refractive index higher than the refractive index of the compound semiconductor material of the first compound semiconductor layer is formed in the first compound semiconductor layer. Therefore, the optical confinement factor can be lowered. Further, since the peak of the light field intensity distribution is moved from the active layer to the first compound semiconductor layer, the light emission efficiency of the active layer scarcely deteriorates in spite of the fact that a high current flows in the active layer. Therefore, the high output can be realized and the single-mode light beam can be outputted (or generated).

Second Embodiment

In a second embodiment, which is a modification of the first embodiment, a semiconductor optical amplifier (SOA) 300 that amplifies a laser beam from a laser light source 200 and outputs the amplified laser beam is configured by a light-emitting device of the second embodiment. FIG. 8 is a conceptual diagram illustrating an optical output apparatus including the semiconductor optical amplifier according to the second embodiment. The semiconductor laser device configuring the laser light source 200 and the semiconductor optical amplifier 300 have practically the same configuration as the light-emitting device described above in the first embodiment.

In the optical output apparatus according to the second embodiment, the laser beam output from the laser light source 200 is incident on a reflection mirror 320 via an optical isolator 316 and a reflection mirror 317. The laser beam reflected from the reflection mirror 320 is incident on the semiconductor optical amplifier 300 through a half-wavelength plate (λ/2 wavelength plate) 321 and a lens 322. Further, the optical isolator 316 is disposed to prevent a beam returned from the semiconductor optical amplifier 300 from going toward the laser light source 200. The laser beam is amplified by the semiconductor optical amplifier 300 and is output to the outside of the system via a lens 330.

The semiconductor optical amplifier 300 is configured by a transmissive semiconductor optical amplifier. An anti-reflection coating layer (AR) is formed in each of a light-incident end surface (first end surface) 301 of the semiconductor optical amplifier 300 and a light-exit end surface (second end surface) 302 facing the light-incident end surface 301. The low-reflection coating layer (AR) has a layer structure of a single titanium oxide layer and a single aluminum oxide layer. The laser beam incident from the side of the light-incident end surface 301 is amplified in the semiconductor optical amplifier 300 and is output from the light-exit end surface 302 of an opposite side. The laser beam is basically guided only in one direction. In the second embodiment, the laser light source 200 is configured by the semiconductor laser apparatus assembly of the first embodiment including the semiconductor laser device serving as the light-emitting device of the first embodiment. The laser beam output from the laser light source 200 is incident on the semiconductor optical amplifier 300. Specifically, the laser light source 200 generating the laser beam to be incident on the semiconductor optical amplifier 300 is configured by a mode locked semiconductor laser device. The pulsed laser beam output from the mode locked semiconductor laser device is incident on the semiconductor optical amplifier 300.

Since the light-emitting device of the second embodiment has the same configuration as the light-emitting device of the first embodiment except for the above-described configuration, the detailed configuration thereof will not be repeated.

The semiconductor optical amplifier is configured by the transmissive semiconductor optical amplifier, but the embodiment of the present disclosure is not limited thereto. For example, the semiconductor optical amplifier may be configured by a monolithic type semiconductor optical amplifier.

The preferred embodiments of the present disclosure have been described, but embodiments of the present disclosure are not limited thereto. The configurations and structures of the light-emitting device, the semiconductor laser device, the semiconductor laser apparatus assembly, the semiconductor optical amplifier, the optical output apparatus, and the laser light source described in the embodiments are merely examples, and may be appropriately modified. In the above-described embodiments, various values have been used, but are merely examples. For example, the various values are, of course, changed depending on specifications of the light-emitting device to be used. In the above-described embodiments, the high-refractive index layer has been formed in the first light guiding layer. However, the high-refractive index layer may be formed in the first clad layer depending on a case. In this case, the refractive index of a compound semiconductor material of the high-refractive index layer is set to be higher than the refractive index of the compound semiconductor material of the first clad layer. For example, the axis line of the light-emitting device and the axis line of the ridge stripe configuration may form a predetermined angle or a planar shape of the ridge stripe configuration may be a tapered shape.

In the above-described embodiments, the light-emitting device has been formed on a C plane which is a polar plane, that is, the {0001} plane of an n-type GaN substrate. Alternatively, the light-emitting device may be formed on a non-polar plane such as the A plane which is the {11-20} plane, the M plane which is the {1-100} plane, or a semipolar plane such as, the {11-2n} plane including the {11-24} plane and the {11-22} plane, the {10-11} plane or the {10-12} plane. Thus, even when piezoelectric polarization and spontaneous polarization occur in the active layer of the light-emitting device, no piezoelectric polarization occurs in the thickness direction of the active layer and the piezoelectric polarization occurs in a direction substantially perpendicular to the thickness direction of the active layer. Therefore, an adverse effect caused due to the piezoelectric polarization and spontaneous polarization can be excluded. Further, {11-2n} plane means a non-polar plane that forms substantially 40 degrees with the C plane.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

[1] <<Light-Emitting Device>>

A light-emitting device comprising:

(a) a layer structure obtained by sequentially growing on a base substrate a first compound semiconductor layer of a first conductivity type, an active layer formed of a compound semiconductor, and a second compound semiconductor layer of a second conductivity type different from the first conductivity type;

(b) a second electrode formed on the second compound semiconductor layer; and (c) a first electrode electrically connected to the first compound semiconductor layer, wherein the layer structure has a configuration formed of at least a part of the second compound semiconductor layer in a thickness direction of the second compound semiconductor layer, the first compound semiconductor layer has a thickness greater than 0.6 μm, and a high-refractive index layer formed of a compound semiconductor material having a refractive index higher than a refractive index of a compound semiconductor material of the first compound semiconductor layer is formed in the first compound semiconductor layer.

[1-1] The light-emitting device according to [1], wherein the layer structure has a ridge stripe configuration.

[2] The light-emitting device according to [1], wherein the first compound semiconductor layer has a layer structure obtained by sequentially growing a first clad layer and a first light guiding layer from a side of the base substrate, the first light guiding layer has a thickness greater than 0.6 μm, and the high-refractive index layer is formed in the first light guiding layer.

[3] The light-emitting device according to [2], wherein a distance from an interface between the active layer and the first light guiding layer to an interface between a portion of the first light guiding layer located closer to the active layer and the high-refractive index layer is 0.25 μm or more.

[4] The light-emitting device according to [2] or [3], wherein, provided that a refractive index of a compound semiconductor material of the first light guiding layer is $n_{G-1}$ and the refractive index of a compound semiconductor material of the high-refractive index layer is $n_{HR}$, "$0<n_{HR}-n_{G-1}\leq 0.3$" is satisfied.

[5] The light-emitting device according to any one of [1] to [4], wherein the light-emitting device outputs a single-mode light beam.

[6] The light-emitting device according to any one of [1] to [5], wherein the light-emitting device is configured by a semiconductor laser device.

[7] The light-emitting device according to any one of [1] to [5], wherein the light-emitting device is configured by a semiconductor optical amplifier.

[8] The light-emitting device according to any one of [2] to [6],
wherein the second compound semiconductor layer has a layer structure obtained by sequentially growing a second light guiding layer and a second clad layer from the side of the base substrate, and
the first light guiding layer is thicker than the second light guiding layer.

[9] The light-emitting device according to any one of [1] to [8], wherein the first compound semiconductor layer, the active layer, and the second compound semiconductor layer are formed of a GaN-based compound semiconductor.

The present application claims priority to Japanese Priority Patent Application JP 2011-210355 filed in the Japan Patent Office on Sep. 27, 2011, the entire content of which is hereby incorporated by reference.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims The invention is claimed as follows:

1. A light-emitting device comprising:
a layer structure obtained by sequentially growing on a base substrate a first compound semiconductor layer of a first conductivity type, an active layer formed of a compound semiconductor, and a second compound semiconductor layer of a second conductivity type different from the first conductivity type;
a second electrode formed on the second compound semiconductor layer; and
a first electrode electrically connected to the first compound semiconductor layer,
wherein the layer structure has a configuration formed of at least a part of the second compound semiconductor layer in a thickness direction of the second compound semiconductor layer,
the first compound semiconductor layer has a thickness greater than 0.6 μm, and
a high-refractive index layer formed of a compound semiconductor material having a refractive index higher than a refractive index of a compound semiconductor material of the first compound semiconductor layer is formed in the first compound semiconductor layer.

2. The light-emitting device according to claim 1, wherein the layer structure has a ridge stripe configuration.

3. The light-emitting device according to claim 1,
wherein the first compound semiconductor layer has a layer structure obtained by sequentially growing a first clad layer and a first light guiding layer from a side of the base substrate,
the first light guiding layer has a thickness greater than 0.6 μm, and
the high-refractive index layer is formed in the first light guiding layer.

4. The light-emitting device according to claim 3, wherein a distance from an interface between the active layer and the first light guiding layer to an interface between a portion of the first light guiding layer located closer to the active layer and the high-refractive index layer is 0.25 μm or more.

5. The light-emitting device according to claim 3, wherein, provided that a refractive index of a compound semiconductor material of the first light guiding layer is $n_{G-1}$ and the refractive index of a compound semiconductor material of the high-refractive index layer is $n_{HR}$, "$0 < n_{HR} - n_{G-1} \leq 0.3$" is satisfied.

6. The light-emitting device according to claim 1, wherein the light-emitting device outputs a single-mode light beam.

7. The light-emitting device according to claim 1, wherein the light-emitting device is configured by a semiconductor laser device.

8. The light-emitting device according to claim 1, wherein the light-emitting device is configured by a semiconductor optical amplifier.

9. The light-emitting device according to claim 3,
wherein the second compound semiconductor layer has a layer structure obtained by sequentially growing a second light guiding layer and a second clad layer from the side of the base substrate, and
the first light guiding layer is thicker than the second light guiding layer.

10. The light-emitting device according to claim 1, wherein the first compound semiconductor layer, the active layer, and the second compound semiconductor layer are formed of a GaN-based compound semiconductor.

* * * * *